United States Patent

[11] 3,615,450

[72] Inventors Frank X. Werber
Ridgewood, N.J.;
Walter R. Wszolek, Sykesville; Clifton L. Kehr, Silver Spring, Md.

[21] Appl. No. 63,312
[22] Filed Aug. 11, 1970
[45] Patented Oct. 26, 1971
[73] Assignee W. R. Grace & Co.
New York, N.Y.
Continuation-in-part of application Ser. No. 674,773, Oct. 12, 1967, now abandoned.

[54] METHOD OF PREPARING PRINTING PLATES
18 Claims, No Drawings

[52] U.S. Cl. .......... 96/35.1, 96/36.3, 96/36
[51] Int. Cl. .......... G03c 5/00
[50] Field of Search .......... 96/35.1, 36.3, 36, 115

[56] References Cited

UNITED STATES PATENTS

| | | | |
|---|---|---|---|
| 3,055,758 | 9/1962 | McDonald | 96/48 |
| 3,145,104 | 8/1964 | Oster | 96/36.3 |
| 3,306,745 | 2/1967 | Webers | 96/35.1 |
| 3,427,161 | 2/1969 | Laridon | 96/36.3 |

*Primary Examiner*—Norman G. Torchin
*Assistant Examiner*—J. R. Hightower
*Attorneys*—Eugene M. Bond and Kenneth E. Prince

ABSTRACT: The invention disclosed is for a method of preparing a printing plate from a liquid polymer composition which includes a polyene defining a liquid polyfunctional component having molecules containing at least two reactive ethylenically or acetylenically unsaturated carbon-to-carbon bonds per molecule, and a liquid polythiol component having molecules containing at least two thiol groups per molecule, with the total functionality of the polyene and polythiol components being greater than four. Optionally, a photocuring rate accelerator is also included in the liquid polymer composition. The photocurable liquid polymer composition may be selectively insolubilized by actinic light to form a solid elastomeric or resinous printing plate.

METHOD OF PREPARING PRINTING PLATES

The present application for U.S. Pat. is a continuation-in-part of copending application Ser. No. 674,773, filed Oct. 12, 1967, now abandoned.

This invention relates to a method of preparing a printing plate by selectively exposing to actinic radiation a liquid polymer composition which includes a polyene defining a liquid polyfunctional component having molecules containing at least two reactive ethylenically or acetylenically unsaturated carbon-to-carbon bonds per molecule, and a liquid polythiol component having molecules containing at least two thiol groups per molecule, with the total functionality of the polyene and polythiol components being greater than four.

Numerous attempts have been made in the prior art to prepare printing plates using polymeric systems which selectively insolubilize by exposure to visible light or actinic radiation. For example, Oster et al. disclose in U.S. Pat. No 3,145,104 a photoreproductive process whereby cross-linking of a thiol polymer may be effected by using visible light provided that certain dyes are used as sensitizers. Apparently, when such a system containing thiol polymer and photoreducible dye is irradiated with visible light, the light-excited dye effects an oxidation of the thiol groups so that pairs of these groups on neighboring polymer molecules combine to form a cross-linking disulfide bond.

In a McDonald patent, U.S. Pat. No 3,055,758, production of positive images is disclosed using a photosensitive layer formed of a water-permeable colloid binder and a dispersed liquid mixture of a thiol and an ethylenically unsaturated compound, and if desired, an addition polymerization initiator activatable by actinic light. This McDonald process is directed to forming colored salts (images) in a water-permeable photographic gelatin. These colored salts are formed in a photographic film by the reaction of free mercaptan in the imagewise unexposed areas with a metal ion contained in a soak solution or developer. In the imagewise exposed areas of the film the thiol compound appears to react with an ethylenically unsaturated monomer under the influence of actinic light. This reaction destroys the thiol group, converts it to a form which is unreactive to the developer containing lead ions. The net result is that the exposed image areas remain colorless and are removed whereas the unexposed areas turn yellow when the film is coated with the developer containing the metal ions.

Another example of a prior art attempt to prepare printing plates is that disclosed by Webers in U.S. Pat. No. 3,306,745. Webers employs a photopolymerizable composition which includes a preformed compatible macromolecular polymer binding agent, a polymerizable ethylenically unsaturated compound, a polymerization initiator, and a chalcogen such as sulfur or selenium. Webers requires the presence of a binder to form a coherent solid film prior to photoexposure to actinic light.

Methods for preparing printing plates such as those previously described have received limited acceptance by the printing industry. Typically, these methods necessitate care and great skill to prepare a printing plate, they have proven to be expensive, they prepare plates of poor quality resulting in shutdowns during printing, or simply result in printing plates characterized with poor quality printing.

It has now been found that numerous defects of the prior art may be effectively overcome by practice of the present invention which provides a method for preparing a printing plate by selectively exposing to actinic radiation, a liquid polymer composition which includes a polyene defining a liquid polyfunctional component having molecules containing at least two reactive ethylenically or acetylenically unsaturated carbon-to-carbon bonds per molecule, and a liquid polythiol component having molecules containing at least two thiol groups per molecule, with the total functionality of the polyene and polythiol components being greater than four. Upon exposure to actinic light such as ultraviolet light, the photocurable composition may be cured rapidly and controllably to form a highly acceptable printing plate which is low in cost and equal or better in reaction rate in polymer formation when compared with prior art compositions and conventional technology for forming printing plates. Accordingly, printing plates of uniform relief may be rapidly prepared by practice of the present invention upon exposing the present composition to actinic light through an image-bearing, line or halftone, positive or negative transparency, stencil, or the like consisting solely of substantially opaque and substantially transparent areas wherein the opaque areas are substantially of the same optical density. A layer of a photocurable composition consisting of a defined polyene and polythio may be exposed while on a support until substantially complete photocuring takes place in the exposed areas and substantially no curing takes place in the unexposed areas. Thereafter the uncured composition from said unexposed areas may be removed as desired.

Generally, the present photocurable composition comprises a particular polyene defining a liquid poly-functional component, a particular liquid polythio component, and optionally a photocuring rate accelerator.

An example of a first group of materials useful as the polyene component herein is that represented by the formula $$\left[A\right]\!\left(X\right)_m$$

wherein *m* is an integer of at least two, wherein X is a member selected from the group consisting of:

(a)
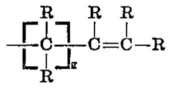

(b)
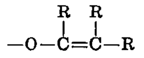

(c)
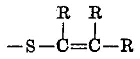

(d)
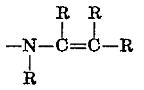

(e)
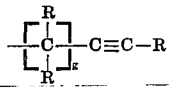

In the groups (*a*) to (*e*), is an integer from one to nine; R is a radical selected from the group consisting of hydrogen, fluorine, chlorine, furyl, thienyl, pyridyl, phenyl and substituted phenyl, benzyl and substituted benzyl, alkyl and substituted alkyl, alkoxy and substituted alkoxy, and cycloalkyl and substituted cycloalkyl. The substituents on the substituted members are selected from the group consisting of nitro, chloro, fluoro acetoxy, acetamide, phenyl, benzyl, alkyl, alkoxy and cycloalkyl. Alkyl and alkoxy have from one to none carbon atoms and cyclo-alkyl has from three to eight carbon atoms.

The members (*a*) to (*e*) are connected to [A] through divalent chemically compatible derivative members. The members (*a*) to (*e*) may be connected to [A] through a divalent chemically compatible derivative member of the group consisting of $Si(R)_2$, carbonate, carboxylate, sulfone, -O-,

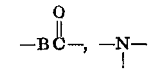

alkyl and substituted alkyl, cycloalkyl and substituted cycloalkyl, urethane and substituted urethane, urea and substituted urea, amide and substituted amide, amine and substituted amine, and aryl and substituted aryl. The alkyl members have from one to nine carbon atoms, the aryl members are either phenyl or naphthyl, and the cycloalkyl members have from three to eight carbon atoms with R and said members substituted being defined above. B is a member of the group consisting of -O-, -S-, and -NR-.

The member [A] is a polyvalent; free of reactive carbon-to-carbon unsaturation; free of highly water-sensitive members; and consisting of atoms selected from the group consisting of carbon, oxygen, nitrogen chlorine, bromine, fluorine, phosphorus, silicon, and hydrogen.

The members of this first group useful as the polyene component have a molecular weight in the range from about 64 to 20,000; preferably about 200 to about 10,000; and a viscosity in the range from essentially 0 to 20 million centipoises at 70° C. as measured by a Brookfield Viscometer.

More particularly, the member [A] of these polyenes may be formed primarily of alkyl radicals, phenyl and urethane derivatives, oxygenated radicals, and nitrogen substituted radicals. The member [A] may also be represented by the formula $$R_2-\left(CH_2-\overset{\displaystyle H}{\underset{\displaystyle R_3}{C}}\right)_j\left(CH_2-\overset{\displaystyle H}{\underset{\displaystyle R_4}{C}}\right)_k-R_2$$

wherein $j$ and $k$ are integers greater than one; $R_2$ is a member of the group consisting of hydrogen, and alkyl having one to nine carbon atoms; $R_3$ is a member of the group consisting of hydrogen, and saturated alkyl having one to nine carbon atoms; $R_4$ is a divalent derivative of the group consisting of phenyl, benzyl, alkyl, cycloalkyl, substituted phenyl, substituted benzyl, substituted alkyl, and substituted cycloalkyl;

with the terms alkyl, cycloalkyl and members substituted being defined above.

General representative formulas for the aforesaid polyenes are:

I- Poly(alkylene ether) Polyol Reacted with Unsaturated Monoisocyanates Forming Polyurethane Polyenes and Related Polymers Difunctional

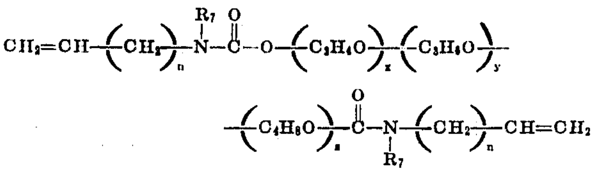

Trifunctional

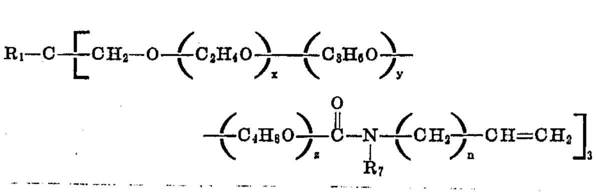

Tetrafunctional

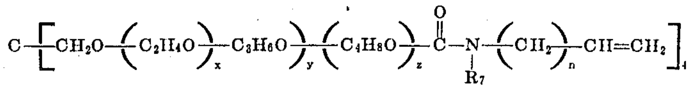

Tri-to-hexafunctional

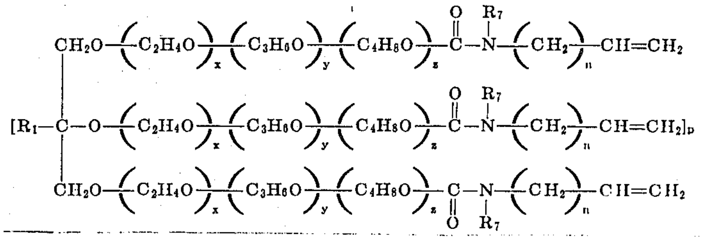

Interconnected-modified difunctional

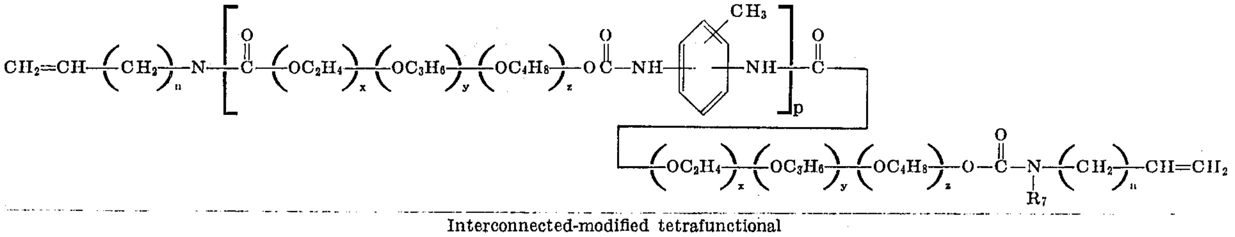

Interconnected-modified tetrafunctional

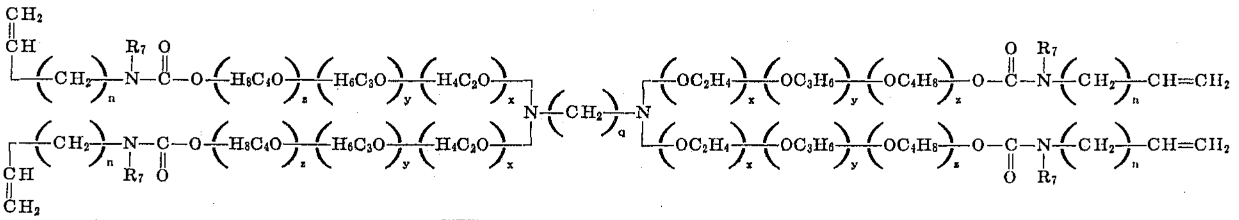

II- Poly (alkylene ester) Polyol Reacted with Unsaturated Monoisocyanates Forming Polyurethane Polyenes and Related Polymers Difunctional

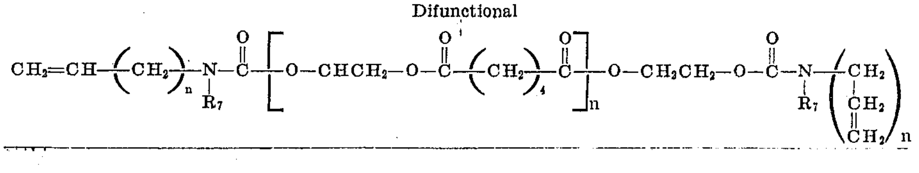

Interconnected-modified difunctional

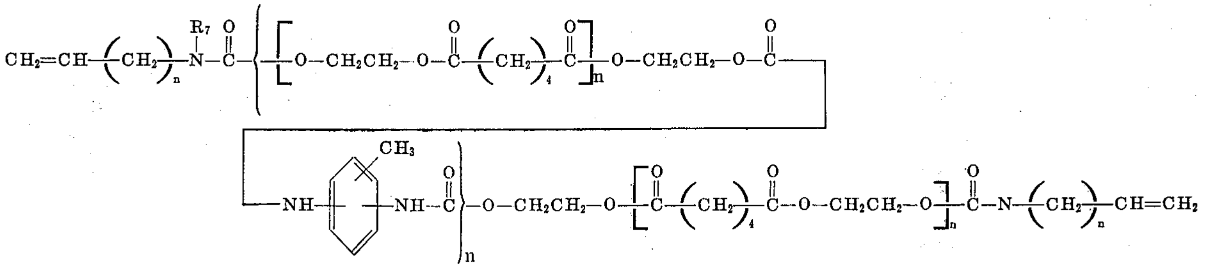

III- Poly(alkylene ether) Polyol Reacted with Polyisocyanate and Unsaturated Monoalcohol Forming Polyurethane Polyenes and Related Poylmers Difunctional

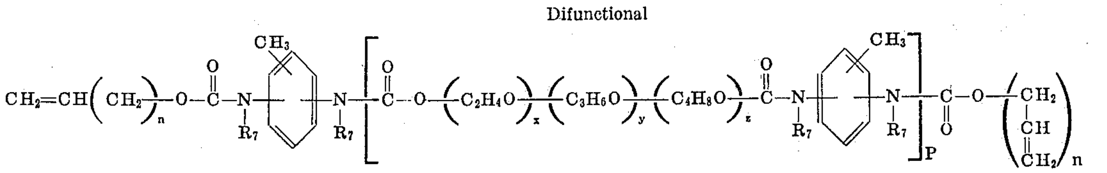

Trifunctional

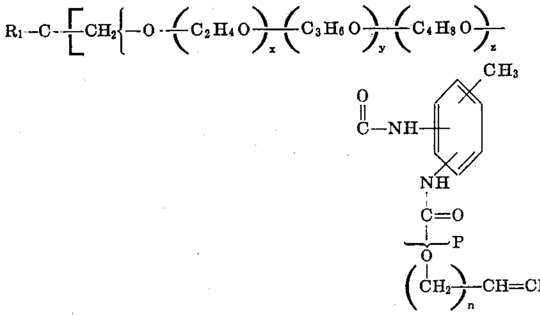

Tetrafunctional

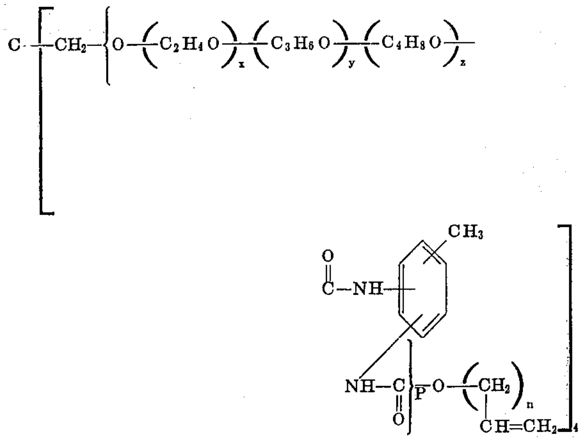

In the above formulas, the sum of $x+y+z$ in each chain segment is at least one; P is an integer of 1 or more; $q$ is at least two; $n$ is at least one; $R_1$ is selected from the group consisting of hydrogen, phenyl, benzyl, alkyl, cycloalkyl, and substituted phenyl; and $R_7$ is a member of the group consisting of $$CH_2{=}CH{-}(CH_2)_n{-}$$

, hydrogen, phenyl, cycloalkyl, and alkyl.

Another group of polyenes operable herein includes unsaturated polymers in which the double or triple bonds occur primarily within the main chain of the molecules. Examples of this group of polyenes include conventional elastomers such as those derived primarily from standard diene monomers and represented by polyisoprene, polybutadiene, styrene-butadiene rubber, isobutylene-isoprene rubber, polychloroprene, styrene-butadiene-acrylonitirile rubber, and the like; unsaturated polyesters, polyamides, and polyurethanes derived from monomers containing reactive unsaturation and exemplified by adipic acid-butenediol, 1,6-hexandeiamine-fumaric acid, 2,4-tolylene diisocyanate-butenediol condensation polymers, and the like.

A third group of polyenes herein includes those polyenes in which the reactive unsaturated carbon-to-carbon bonds are conjugated with adjacent unsaturated groupings. Examples of operable reactive conjugated ene systems include but are not limited to the following:

$$-\overset{|}{C}=\overset{|}{C}-\overset{O}{\overset{\|}{C}}-;\quad -\overset{|}{C}=\overset{|}{C}-\underset{\underset{O}{\|}}{\overset{\overset{O}{\|}}{S}}-;\ \text{and}\ -\overset{|}{C}=\overset{|}{C}-\underset{|}{\overset{\overset{O}{\|}}{P}}-.$$

A few typical examples of polymeric polyenes which contain conjugated reactive double bond grouping such as those described above are poly(ethylene ether) glycol (600M.W.) diacrylate; poly(tetramethylene ether) glycol (1000M.W.) dimethacrylate; the triacrylate of the reaction product of trimethylol propane with 20 moles of ethylene oxide; diethylene glycol diacrylate; and the like.

The polythiol component of the present photocurable polymer composition may be a simple or complex organic compound having a multiplicity of pendant or terminally positioned -Sh functional groups per average molecule.

On the average the polythiol must contain two or more -SH groups per molecule and have a viscosity range of essentially 0 to 20 million centipoises (cps) at 70° C. as measured by a Brookfield Viscometer either alone or when in the presence of an inert solvent, aqueous dispersant, or plasticizer. Operable polythiols usually have molecular weights in the range about 50 to about 20,000 and preferably from about 100 to about 10,000.

The polythiols operable herein may be exemplified by the general formula $R_8{-}(SH)_n$ where $n$ is at least 2 and $R_8$ is a polyvalent organic moiety free from reactive carbon-to-carbon unsaturation. Thus $R_8$ may contain cyclic groupings and hetero atoms such as N, P, or O and primarily contain carbon-carbon, carbon-hydrogen, carbon-oxygen, or silicon-oxygen containing chain linkages free of any reactive carbon-to-carbon unsaturation.

One class of polythios operable with polyenes to obtain essentially odorless polythioether products are esters of thiol-containing acids of the formula $HS{-}R_9{-}COOH$ where $R_9$ is an organic moiety containing no reactive carbon-to-carbon unsaturation with polythydroxy compounds of structure $$R_{10}{-}(OH)_n$$

where $R_{10}$ is an organic moiety containing no reactive carbon-to-carbon unsaturation, and $n$ is two or greater. These components will react under suitable conditions to give a polythiol having the general structure:

$$R_{10}\left(-O\overset{O}{\overset{\|}{C}}-R_9-SH\right)_n$$

where $R_9$ and $R_{10}$ are organic moieties containing no reactive carbon-to-carbon unsaturation, and $n$ is two or greater.

Polythiols such as the aliphatic monomeric polythiols exemplified by ethane dithiol, hexamethylene dithiol, decamethylene dithiol, tolylene-2,4-dithiol, and the like, and polymeric polythiols such as thiol-terminated ethylcyclohexyl dimercaptan polymer, and the like, are operable but may not be widely accepted from a practical commercial point of view because of obnoxious odors. Examples of the polythiol compounds preferred because of relatively low odor level include esters of thioglycolic acid $HS\text{-}CH_2COOH$), α-mercaptopropionic acid ($HS\text{-}CH(CH_3)$ -COOH), and β-mercaptopropionic acid ($HS\text{-}CH_2CH_2COCH$) with polyhydroxy compounds such as glycols, triols, tetraols, pentaols, hexaols, and the like. Specific examples of the preferred polythiols include ethylene glycol bis (thioglycolate, ethylene glycol bis (β-mercaptopropionate), trimethylol-propane tris (thioglycolate), trimethylolpropane tris (β-mercaptopropionate), pentaerythritol tetrakis (thioglycolate), and pentaerythritol tetrakis (β-mercaptopropionate), all of which are commercially available. A specific example of a preferred polymeric polythiol is poly (propylene ether) glycol bis(β-mercaptopropionate) which is prepared from poly(propylene ether) glycol (e.g., Pluracol P—2010, Wyandotte Chemical Corr.) and β-mercaptopropionic acid by esterification.

The preferred polythiol compounds are characterized by a low level of mercaptanlike odor initially, and after reaction give essentially odorless polythioether end products which are commercially attractive and practically useful resins or elastomers for most printing plate applications.

To obtain the maximum strength, solvent resistance, creep resistance, heat resistance and freedom from tackiness, the polyene and polythiol components are formulated in such a manner as to give solid, cross-linked, three-dimensional network polythioether polymer systems on curing. In order to achieve such infinite network formation, the individual polyenes and polythiols must each have an average functionality of at least two and the sum of the functionalities of the polyene and polythiol components must always be greater than four. Blends and mixtures of the polyenes and the polythiols containing such functionalities are also operable herein. For example, a minor quantity of monoene or monothiol may be present in the photocurable composition so long as a compensating quantity of polyfunctional ene or thiol having functionalities greater than two is present to provide an average functionality for the ene component of at least two, an average functionality of the thiol component of at least two, with the sum of the average functionalities of the ene component and thiol component being greater than four.

The molecular weight of the polyenes of the instant invention can be measured by various conventional methods including solution viscosity, osmotic pressure, and gel permeation chromatography. Additionally, the molecular weight can be sometimes calculated from the known molecular weight of the reactants.

The viscosity of the polyenes and polythiols can be measured on a Brookfield Viscometer at 30° or 70° C. in accord with the instructions therefor.

The preferred photocurable polyene/polythiol compositions have viscosities in the range 0.25 to 350 and preferably from 5 to 150 poises at or below 70° C.

The polyene/polythiol mole ratio is selected so as to provide a solid, self-supporting, cured product under ambient conditions in the presence of actinic light.

In general, it is preferred, especially at or near the operable lower limits of functionality in the polyene and polythiol, to use the polythiol and the polyene components in such amounts that there is one thiol group present for each double bond, it being understood that the total functionality of the system must be greater than four, and the functionality of the polythiol and the polyene must each be at least two. For example, if two moles of a triene are used, and a dithiol is used as the curing agent, making the total functionality have a value of five, it is preferable to use three moles of the dithiol. If much less than this amount of the thiol is used, the curing rate will be lower and the product will be weaker because of the reduced cross-link density. If more than the stoichiometric amount of the thiol is used, the rate of cure may be higher, if that is desirable, although excessive amounts can lead to a plasticized cross-linked product which may not have the desired properties.

It is possible to adjust the relative amount of polyenes and polythiols to any values above or below the stoichiometric amount which will lead to insolubilization in the imagewise exposed areas and which give the desirable properties to the cross-linked polythioether. In general, the mole ratio on ene/thiol groups for preparing the curable composition is from about 0.2/1 to about 5/1, and desirably, about 0.75/1 to about 1.5/1 group ratio.

It must be emphasized that regardless of the ratio of polythiol to polyene, the total functionality of the system must be greater than four or a cross-linked network will not result and the product will be a swellable, chain-extended composition which is unsuitable for the purpose of this invention. Thus, in practicing the instant invention, to obtain a solid cross-linked printing plate it is necessary to use a polyene containing at least two unsaturated carbon-to-carbon bonds per molecule in an amount that the combined functionality of the unsaturated carbon-to-carbon bonds per molecule and the thiol groups per molecule is greater than four.

A photocuring rate accelerator may be present as a separate and distinct component of the photocurable composition. The accelerator may be, for example, azobenzene; or a mixture of two or more separate components such as benzophenone, benzanthrone, anthrone, dibenzosuberone, carbon tetrachloride, phenanthrene, and the like; or in a chemically combined form within the molecular structure of either the polyene or the polythiol. An example of this latter condition wherein the photocuring rate accelerator is present not as a separate component but rather in a form chemically combined within the polyene component is the following structure which contains four reactive carbon-to-carbon unsaturated groupings and one diaryl ketone grouping per average molecule:

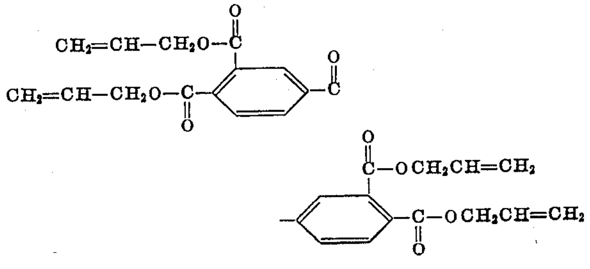

It is further understood that the polyene, the polythiol or the photocuring rate accelerator may be formed in situ in the photocurable composition if desired.

Specifically useful herein are chemical photocuring rate accelerators such as benzophenone, acetophenone, acenaphthenequinone, o-methoxybenzophenone, thioxanthen-9-one, xanthen-9-one, 7*H*-benz[de]anthracen-7-one, dibenzosuberone, 1naphthaldehyde, 4,4'- bis(dimethylamino)benzophenone, fluoren-9-one. 1'-acetonaphtone, 2'acetonaphthone, anthraquinone, 1-indanone, 2-tert-butylanthraquinone, valerophenone, hexanophenone, 8-phenylbutyrophenone, P-morpholinopropiophenone, 4-morpholinobenzophenone, 4'-morpholinodeoxybenzoin, P-diacetylbenzene, 4-aminobenzophenone, 4'-methoxyacetophenone, benzaldehyde, α-tetralone, 9-acetylphenanthrene, 2-acetylphenanthrene, 10-thioxanthenone, 3acetylphenanthrene, 3-acetylindole, 1,3,5-triacetylbenzene, and the like, including blends thereof, to greatly reduce the exposure time.

The curing rate accelerators are usually added in an amount ranging from about 0.0005 to about 50 percent by weight of the photocurable compositions, with a preferred range being from about 0.05 to about 25percent by weight. Preferred photocuring rate accelerators are the aldehyde and ketone carbonyl compounds having at least one aromatic nucleus attached directly to the $$-\overset{O}{\overset{\|}{C}}-$$

group.

The photocurable composition may if desired, include additives such as antioxidants, accelerators, dyes, inhibitors, activators, fillers pigments, antistatic agents, flame-retardant agents, thickeners, thixotropic agents, surface-active agents, viscosity modifiers, extending oils, plasticizers, tackifiers, and the like within the scope of this invention. Such additives are usually preblended with the polyene or polythiol prior to or during the compounding step. Operable fillers include natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, and the like, The aforesaid additives may be present in quantities up to 500 parts or more per 100 parts polymer by weight and preferably about 0.005 to about 300 parts on the same basis.

Conventional curing inhibitors or retarders which may be used in order to stabilize the components or curable compositions so as to prevent premature onset of curing may include hydroquinone; p-tert-butyl catechol; 2,6-di-tert-butyl-p-methylphenol; phenothiazine; N-pheyl-2-naphthylamine; inert gas atmospheres such as helium, argon, nitrogen, and carbon dioxide; vacuum; and the like.

The majority of the commercially available monomers and polymers used in the photocurable compositons normally contain minor amounts (about 50–5000 parts per million by weight) of inhibitors to prevent spontaneous polymerization prior to use in making a printing plate. The presence of these inhibitors, which are usually antioxidants, e.g., hydroquinone and the like, in optimum amounts causes no undesirable results in the photocurable layer of this invention.

The compounding of the components prior to curing may be carried out in several ways. For example, the polyene, the polythiol, and any other additives may be admixed and charged to an aerosol can, drum, tube, or cartridge for subsequent use.

Another useful method of compounding is to prepare in an ambient atmosphere by conventional mixing techniques but in the absence of actinic radiation a composition consisting of polyene, antioxidant (to inhibit spontaneous oxygen-initiated curing), polythiol, UV sensitizer or photoinitiator, and other inert additives. This composition may be stored in the dark for extended periods of time, but on exposure to actinic radiation such as ultraviolet light, sunlight, or the like, will cure controllably and in a very short time period to solid polythioether products.

Although the mechanism of the curing reaction is not completely understood, it appears most likely that the curing reaction may be initiated by most any actinic light source which dissociates or abstracts a hydrogen atom from an SH group, or accomplishes the equivalent thereof. Generally, the rate of the curing reaction may be increased by increasing the temperature of the composition at the time of initiation of cure. In many applications, however, curing is accomplished conveniently and economically by operating at ordinary room temperature conditions.

By proper choice of type and concentration of photocuring rate accelerator for initiation, the curing period required for conversion of the polyene/polythiol composition from the liquid to the solid state may be varied greatly as desired. In combination with suitable accelerators or retarders, the curing period may vary from about a second or less to about 30 minutes or more. In general, short curing periods are achieved in applications where thin films of curable composition are required, whereas the long curing periods are achieved and desired where more massive layers of composition are required.

Any type of actinic light from any source may be used in carrying out the method of this invention. For liquid photocurable compositions, it is preferred that the light emanate from a point source or in the form of parallel rays but divergent beams are also operable as a source of actinic light.

Various light sources may be used to obtain sufficient actinic radiation to practice the method of this invention. Such sources include carbon arcs, mercury arcs, fluorescent lamps with special ultraviolet light emitting phosphors, xenon arcs, sunlight, tungsten halide lamps, argon glow lamps, photographic flood lamps, and the like. Of these the mercury vapor arcs, particularly the sunlamp type, and the xenon arcs are very useful. The sunlamp mercury vapor arcs are customarily used at a distance of 7 to 10 inches from the photocurable layer, whereas the xenon arc is placed at a distance of 24 to 40 inches from the photocurable layer, With a more uniform extended source of low intrinsic brilliance, such as a group of contiguous fluorescent lamps with special phosphors, the plate can be exposed within an inch of the lamps.

When the light source is relatively close to the image-bearing transparency, the light rays passing through the clear areas of the transparency enter as divergent beams into the photocurable layer and thus irradiate a continually diverging area in the photocurable layer beneath the clear portion of the transparency. This results in the formation of a truncated frustum of a cured polymer relief with smooth sloping sides which is at its greatest width at the bottom surface of the cured layer. The top surface of the relief is of substantially the same dimensions the clear area of the transparency. Such tapered relief can also be obtained by the use of oblique light beams from sources arranged around the periphery of the exposed area and by rotating the photocurable layer during exposure to equalize the distribution of light during exposure on all portions of the negative.

To obtain the same advantages i.e., a top surface of substantially the same dimension as the clear area of the transparency and wide tapered relief when using a point light or collimated light source with an air gap between the image-bearing transparency and the photocurable composition, it is desirable to add light-scattering, finely divided, reflective particles to the photocurable composition. Both organic and inorganic fillers such as silicas, aluminas, sucrose, succinamide, and the like may be used if desired.

In making printing plates it is essential that the exposure be sufficient to harden the photocurable composition in the exposed image areas without causing significant curing in the nonimage areas. Aside from exposure time and light intensity, the extent of the exposure is dependent on the thickness of the photocurable layer, the curing temperature, the polyene and polythiol employed, the photoinitiator curing rate accelerator, the presence of light absorbing pigments or dyes in the photocurable composition, and the character of the image to be reproduced. In general, the thicker the layer to be cured, the longer the exposure time. It has been observed that curing starts at the surface of the photocurable layer closest to the light source and proceeds downward to the support. With insufficient exposure, the layer may have a hard cure at the surface but, through lack of a clear-through cure, the relief will be removed when the unexposed area is removed. Inasmuch as the curing rate usually increases at higher temperatures, less exposure is required thereat than at room temperature. Thus ultraviolet light sources that emit heat are more efficient than cold ultraviolet light sources. However, care must be exercised that too high a temperature is not attained during the photocure, as this leads, in some cases, to thermal expansion of the photocurable composition which results in image distortion. Hence, it is preferred that the photocuring be carried out at a temperature in the range about 20° to about 70° C. Due to the number of variables which affect exposure time, optimum results are best determined by trial and error, e.g., stepped exposures with characterization after each exposure.

When using a broad light source such that oblique rays are emitted, even a thin parting layer between the surface of the transparency and the photocurable layer causes some broadening of the image. Ordinarily this has very little effect except in the preparation of halftone or line plates with fine lines. Such plates are best prepared with the negatives directly in contact with the surface of the photocurable composition, except for a thin layer of a parting agent. For this reason, a point or collimated light source is preferred so that an airgap can be employed between the photocurable polymer surface and the surface of the image-bearing transparency.

It has been found preferable to maintain an airgap between the photocurable composition and the image-bearing transparency. Such an airgap may range from about 0.1 mil to about 250 mils or more. The airgap facilitates removal of the image-bearing transparency from the vicinity of the cured composition after subjection to actinic light without defacing the cured composition. Contact between the image-bearing transparency and the photocurable composition is operable, if desired. Thus, plate pressure printing frames may be used to maintain contact between the image-bearing transparency and the photocurable composition. If desired, separation of the image-bearing transparency from the cured composition may be facilitated after exposure by introducing a parting layer between the transparency and the photocurable composition. If desired, separation of the image-bearing transparency from the cured composition may be facilitated after exposure by introducing a parting layer between the transparency and the photocurable composition. The parting layer may consist of a thin petrolatum or silicone film coated on the surface of the transparency, or a thin transparent film such as regenerated cellulose or cellulose ester, including cellulose acetate, cellulose propionate, polyethylene terephthalate, and the like. After exposure the transparency may, if desired, be removed from contact with the cured or parting layer for reuse.

It is also possible, especially when a solid or gel photocurable layer is employed, to superimpose on the photocurable layer a strippable protective layer. This protects the photocured surface from scratches and from adhering dust particles if the layer is tacky. The strippable layer may be UV transparent or opaque and in the case of the former, may be left on the photocurable layer during exposure, thus also serving as a parting layer between the image-bearing transparency and the photocured layer. With an opaque strippable protective layer, the layer is removed prior to exposure. The protective layer need not necessarily be a strippable film and it has been found that dusting the top of the photocurable plate with talc or other similar unreactive materials satisfactorily eliminates the problem of tackiness. In some instances the composition is dusted with talc or other similar unreactive material after curing to eliminate tackiness.

The transparent or translucent photocurable composition layer is cured essentially clear through to the support where exposed to actinic light, whereas the unexposed areas remain in substantially their original state, i.e., no significant curing takes place in the areas protected by the opaque image in the image-bearing transparency. If a liquid photocurable composition is used initially, the uncured portion is readily removed with a brush blotter, sponge, or other mechanical means, or with a suitable liquid or solvent therefore, e.g., water and a detergent, or by a combination of the above methods. If the photocurable composition is a viscous semisolid or gel, more vigorous treatment is required to remove the uncured portion thereof, for example, extensive washing with solvent and/or mechanical means, and possibly with the use of higher temperature treatments.

The difference in solubility between the cured areas in the photocured layer and the portions of said layer which remain uncured determines the efficiency of the relief plate making process. Also, the quicker the exposed area becomes insoluble, the more efficient the process. That is, the faster the cross-links in the photocurable composition are formed, the quicker a cross-linked network structure is developed with its resulting insolubility in selective etching or wash-out solvents.

The solvent used for washing (i.e., developing the relief image) of the printing plates made from the photocurable composition is primarily a diluent which reduces the viscosity of the uncured mixture so that it is easily removed. Removal may be speeded up by blotting with a sponge and the like. The washing liquid is selected so that it is readily miscible with or emulsified with the uncured material, yet has little action on the cured image or polymer support. The preferred solvent liquids are water or water and a detergent and/or soap. Mixtures of methanol and/or ethanol with methyl, ethyl, or propyl acetate are also operable for a large number of photocurable compositions. Other solvents with high evaporation rates are well known to those skilled in the art. It should be noted herein that the term solvent includes not only organic solvents but also water and other aqueous systems wherein the unexposed photocurable layer is soluble (including dispersible) in said systems and the photocured portion is not so affected. The use of aqueous systems as a solvent is advantageous not only economically but also because of the elimination of the hazards involved in handling organic solvents. In those instances where the photocurable layer is acidic or basic, the printing relief may be developed by dissolving or dispersing the unexposed areas in an aqueous system of the opposite polarity, i.e., to use an aqueous acidic solvent system with a basic photocurable layer and vice versa. A specific example of such a system would be the use of an aqueous alkaline developer such as dilute aqueous sodium carbonate or sodium hydroxide solution with the photocurable layer containing acidic thiol or free carboxyl groups. Conversely, an acetic acid solution could be used to rapidly etch or develop a plate wherein the photocurable layer contains polyene or polythiol components wherein amino groups are present in their structures. Obviously, the degree of acidity or alkalinity should not be allowed to reach those levels wherein the essentially completely photocured areas are attacked.

It is also possible to wash at elevated temperatures wherein, for example, the uncured portion of a normally solid photocurable composition melts and is removed as a liquid.

The same types of solvents are also suitable for developing layers of solid or gelled (i.e., thixotropic pastes) fully compounded photocurable compositions.

The fully compounded photocurable composition at the time of imagewise exposure may vary from a liquid to a solid state, including a gel or elastomeric state, The thickness of the layer of the photocurable composition employed depends on the thickness desired in the relief image and on the alignment between the relief figures. That is, if the printing areas are closely aligned, less relief is necessary than if the printing areas are further apart. This is to assure that the nonprinting areas are not contacted with the surface of the material on which the printing is to occur. In the case of photocured halftone, the screening used must be taken into consideration when selecting proper thickness.

In general, the thickness of the layer to be photocured and employed as a printing plate may vary from about 0.1 to about 500 mils or more. For lithographic printing plates, the thickness may range between about 0.1 to about 5 mils; for letterset (dry offset) plates the thickness may be customarily about 5 to about 25 mils; for letterpress printing, thicknesses of about 15 to about 500 mils are common. For letterpress newspaper or magazine printing plates, the thickness of the photocured layer will be about 10 to about 50 mils. In intaglio, the depth of sunken wells varies from about 0.1 to about 5 mils. Thicker layers are sometimes employed for the flexographic printing of designs and relatively large areas with letterpress printing plates.

A supporting base material, i.e., the support, employed may be any natural or synthetic product capable of existence in film sheet, or plate form and may be flexible or rigid, smooth or matte surface, reflective or nonreflective of actinic light. Metals, because of their greater strength in thinner form, are preferably employed as a support. However, where weight is critical plastic paper, or rubber is employed as the support. Additionally, the support layer may be the photocurable composition per se. That is, a portion of the photocurable composition may be poured into a mold and exposed directly to actinic light to solidify the entire layer of the photocurable composition. After solidification, this layer will serve as a support for an additional amount of the photocurable composition poured on top of the support, which additional amount would form the relief after exposure through an image-bearing transparency to actinic light. Another operable modification of the procedure is to cast the photocurable composition onto a transparent plate such as one made of glass, plastic, and the like. Now the layer may be exposed nonimagewise from one side to form a solid base, and imagewise through a transparency from the other side to give the relief image. These two exposures may be made simultaneously or in consecutive fashion as desired.

In those instances where rotary press plates are desired, the support material may be used to form flat relief plates which are then formed to the desired shape. Such rotary press plates may also be prepared by using cylindrically shaped support plates of the various types carrying the curable composition and exposing them directly to actinic light through a concentrically disposed image-bearing transparency.

Suitable metals for a support include steel, aluminum, magnesium, copper, chromium, and the like Additionally, various film-forming plastics may be used such as addition polymers; vinylidene polymers e.g., vinyl chloride, vinylidene chloride copolymers with vinyl chloride, vinyl acetate, styrene, isobutylene, and acrylonitrile; vinylchloride copolymers with the latter polymerizable monomers; the linear condensation polymers such as the polyesters, e.g., polyethylene terephthalate; the polyamides e.g., polyhexamethylene sebacamide; polyester amides, e.g., polyhexamethyleneadipamide/adipate; and the like. Fillers or other reinforcing agents may be present in the synthetic resin or polymer support such as various fibers (synthetic, modified, or natural), e.g., cellulosic fibers such as cotton, cellulose acetate, viscose rayon, and paper; glass wool; nylon; and the like. These reinforced bases may be used in laminated form.

When the support is highly reflective e.g., aluminum, oblique rays of actinic light passing through the image-bearing transparency and photocurable composition reflect off the support at such an angle as to cause curing in nonimage areas. To avoid this, a light absorptive layer is employed between the reflective support and the photocurable composition.

The light-absorptive layer intermediate between the light-reflective support and the photocurable composition can be made from various materials. Suitable materials of this type are dyes and pigments. Useful inorganic pigments for a light-absorptive layer include iron oxide in various forms e.g., Indian red, Venetian red, ocher, umber sienna, iron black, and the like; lead chromate, lead molybdate (chrome yellow and molybdenum orange); cadmium yellow, cadmium red; chromium green; iron blue; manganese black; various carbon blacks such as lamp black, furnace black, channel black, and the like. Organic dyes soluble in the vehicles normally used in applying the light-absorptive layer are best added as pigments in the form of lakes prepared by precipitating an insoluble salt of the dye on an inert inorganic substrate. A list of such lakes and similar organic pigments is shown in "Printing and Litho Inks," J. H. Wolfe, pages 124–173, Fourth Edition, MacNair-Dorland and Co., New York (1949).

If a light-absorptive layer is employed as taught above, it must have adequate adhesion to the support and photocured layer. Said adhesion is usually supplied by suitable polymeric or resin carriers which include, but are not limited to, vinyl halides e.g., polyvinyl chloride; vinyl copolymers particularly of vinyl halides, e.g., vinyl chloride with vinyl acetate, diethyl fumarate, ethyl acrylate, allyl glycidyl ether, glycidyl methacrylate; vinyl chloride/vinyl acetate/maleic anhydride copolymer; polyvinyl butyral; monomeric dimethylacrylate esters of the polyethylene glycols in combination with vinyl chloride copolymers; styrene or diallyl phalate with polyesters such as diethylene glycol maleate, diethylene glycol maleate/phthalate, triethylene glycol fumarate/sebacate; and the like.

Suitable material employed as a light-absorptive material used with a reflective support are dyes and pigments. Pigments are preferred primarily because they do not bleed into the photocurable layer. In any event, these materials must be unreactive with the photocurable layer. These light absorptive materials are preferably applied to the support in suspension in a polymer or resin capable of adhering to the support and the photocurable composition.

One advantage of the instant invention is that line and halftone relief printing plates may be very rapidly. Naturally, the time will vary with the particular photocurable composition, the thickness of the layer to be cured, the photoinitiator curing rate accelerator, and the intensity of the light, but exposure periods from about 1 second to about 20 minutes are usually employed.

A convenient method of carrying out the present invention is to place an image-bearing, line or halftone, stencil or positive or negative transparency parallel to the surface of the photocurable composition which has been cast directly on the support or on a light-absorptive layer on the support. The image-bearing transparency and the surface of the photocurable composition may be in contact or have an airgap therebetween, as desired. The photocurable layer is exposed through the transparency to a source of actinic light, preferably a point or collimated light source when a liquid photocurable composition is used, until the photocurable layer is cured to an insoluble stage in the exposed areas. The thickness of the ultimate relief in such a process may be controlled by varying the thickness of the layer of the photocurable composition. This may be done, for example by inserting removable picture-frame type molds of the desired thickness on the support, casting the photocurable composition into the mold and removing any excess with a doctor blade or similar means. If the fully compounded photocurable composition is a solid under atmospheric conditions, the composition may be precast at elevated temperatures in liquid form to any desired thickness and thereafter solidified. The thus prepared plate may then be imaged and developed preferably at a temperature about the softening point so that the image exposure time and the etching time may be kept as short as possible.

The following examples will aid in explaining, but should not be deemed as limiting, the instant invention. Unless otherwise noted, all parts and percentages are by weight.

FORMATION OF POLYENE PREPOLYMER

Example 1

458 g. (0.23 mole) of a commercially available liquid polymeric diisocyanate sold under the trade name Adiprene L-100 by E. I. du Pont de Nemours & Co., Were charged to a dry resin kettle maintained under a nitrogen atmosphere and equipped with a condenser, stirrer, thermometer, and gas inlet and outlet. 37.8 g. (0.65mole) of allyl alcohol were charged to the kettle and the reaction was continued for 17 hours with stirring at 100° C. Thereafter the nitrogen atmosphere was removed and the kettle was evacuated 8 hours at 1000° C. 50 cc. dry benzene were added to the kettle and the reaction product was azeotroped with benzene to remove the unreacted alcohol. This allyl terminated liquid prepolymer had a molecular weight of approximately 2100 and will hereinafter be referred to as Prepolymer A.

Example 2

One mole of a commercially available polyoxypropylene glycol having a molecular weight of about 1958 and a hydroxyl number of 57.6 was charged to a resin kettle equipped with a condenser, stirrer, thermometer, and a gas inlet and outlet. 4 g. of dibutyl tin dilaurate as a catalyst were added to the kettle along with 348 g. (2.0moles) of tolylene-2,4-diisocyanate and 116 g. (2moles) of allyl alcohol. The reaction was carried out for 20 minutes at room temperature under nitrogen. Traces of excess alcohol were stripped from the reaction kettle by vacuum over a 1-hour period. The thus-formed $CH_2=CH-$ terminated liquid prepolymer had a molecular weight of approximately 2400 and will hereinafter be referred to as Prepolymer B.

Example 3

One note of commercially available poly(ethylene ether) glycol having a molecular weigh of 1450 and a specific gravity of 1.21 was charged to a resin kettle maintained under nitrogen and equipped with a condenser, stirrer, thermometer, and a gas inlet and outlet. 2.9 g. of dibutyl tin dilaurate as a catalyst were charged to the kettle along with 2 moles of tolylene-2,4-diisocyanate and 2 moles of allyl alcohol. The reaction was continued with stirring at 60° C. for 2 hours. Thereafter a vacuum of 1 mm. was applied for 2 hours at 60° C. to remove the traces of excess alcohol. This $CH_2=CH-$ terminated prepolymer had a molecular weight of approximately 1950 and will hereinafter be referred to as Prepolymer C.

Example 4

678 g. (0.34 mole) of a commercially available polyoxypropylene glycol sold under the trade name NIAX by Union Carbide Co. and having a molecular weight of about 2025 were degassed for 2 hours at 100° C. and thereafter charged to a resin kettle maintained under a nitrogen atmosphere and equipped with a condenser, stirrer, thermometer, and gas inlet and outlet. 118 g. (0.68 mole) of tolylene-2,4-diisocyanate were charged to the kettle and the reaction was heated with stirring for 2¾ hours at 120° C. After cooling 58 g. (1.0 mole) of allyl alcohol were added to the kettle and the mixture was refluxed at 120° C. for 16 hours under nitrogen. Traces of excess allyl alcohol were removed overnight by vacuum at 100° C. The allyl terminated liquid prepolymer having a viscosity of 19,400 cps at 30° C. as measured on a Brookfield Viscometer was removed from the kettle and hereinafter will be referred to as Prepolymer D.

Example 5

To a 1 liter resin kettle equipped with stirrer, thermometer, gas inlet and outlet and heated to a temperature of 50° C. were charged 610 g. (0.2 mole) of poly(tetramethylene ether) glycol, commercially available from Quaker Oats Co. and having a hydroxyl number of 37.1 and a molecular weight of 3000, along with 0.3 g. of dibutyl tin dilaurate. The temperature of the kettle was raised to 110° C. and the contents were freed of water under 1 millimeter vacuum for 1 hour. The resin kettle was cooled to 60° and the system was placed under a protective atmosphere of nitrogen throughout the remainder of the reaction. 34.0 g. of allyl isocyanate (0.4 mole) were added dropwise to the kettle at such a rate as to maintain the temperature at 60° C. When the NCO content dropped to 0.54 mg/g., 1 mm. vacuum again was applied and the system was heated at 70° C. for 1 hour. The thus-formed polymer product was a solid at room temperature but at 50° C. is clear and pourable. The polymer product had a viscosity of 1,800 centipoises at 70° C. as measured on a Brookfield Viscometer and an average molecular weight of approximately 3200 and hereinafter will be referred to as Prepolymer E.

Example 6

Example 5 was repeated except that 280 g. (0.14 mole) of poly(teramethylene ether) glycol, commercially available from Quaker Oats Co. having a hydroxyl number of 56 and a molecular weight of 2000 were substituted for the poly(tetramethylene ether) glycol of example 5. In addition, 24 g. (0.282 mole) of allyl isocyanate were used in combination therewith along with 0.1 g. of dibutyl tin dilaurate. The resultant polymer will hereinafter be referred to as Prepolymer F.

Example 7

Example 5 was repeated except that 250 g. (0.25 mole) of poly(tetramethylene ether) glycol commercially available from Quaker Oats co., having a hydroxyl number of 112 and a molecular weight of 1000 were substituted for the poly(tetramethylene ether glycol of example 5. In addition, 42 g. (0.495 mole) of allyl isocyanate were used in combination therewith along with 0.1 g. of dibutyl tin dilaurate. The resultant allyl prepolymer will be referred to hereinafter as Prepolymer G.

EXAMPLE 8

1500 g. (0.47 mole of a linear solid polyester diol having a molecular weight of 3200 and commercially available from Hooker Chemical Corp. under the trade name Rucoflex S-1011-35 were charged to a 3-liter 3-necked flask and heated to 110° C. under vacuum and nitrogen for 1 hour with stirring. 83 g. of allyl isocyanate having a molecular weight of 83.1 and commercially available from Upjohn Co. were added to the flask along with 0.3 cc. of dibutyl tin dilaurate (catalyst) commercially available from J. T. Baker. The reaction was continued at 110° C. with stirring for 1 hour. The thus-formed allyl terminated prepolymer will hereinafter be referred to as Prepolymer H.

Example 9

1500 g. (0.48 mole) of a commercially available linear solid polyester diol, sold under the trade name S-106 by Hoocker Chemical Corp., were charged to a 3-liter flask equipped with stirrer and heated to 110° C. under vacuum and nitrogen. After 1 hour at that temperature, it was cooled to about 60° C. whereat 81 g. of allyl isocyanate were slowly added by means of a dropping funnel along with 0.3 cc. of dibutyl tin dilaurate. The mixture was stirred for 1 hour at a temperature in the range 70°-80° C. This allyl terminated prepolymer will hereinafter be referred to as Prepolymer I.

Example 10

300 g. (0.097 mole) of a commercially available linear solid polyester diol, sold under the trade name S-108 by Hooker Chemical Corp., along with 0.1 cc. of dibutyl tin dilaurate were charged to a 0-liter 4-necked flask equipped with stirrer. The mixture was heated to 110° C. under vacuum and nitrogen and maintained thereat for 1 hour. The mixture was then cooled to 60° C. whereat 16 g. of allyl isocyanate were added. The mixture was heated to 75° C. with stirring and maintained thereat for 1 hour. The allyl terminated prepolymer hereinafter will be referred to as Prepolymer J.

Example 11

To a 2-liter flask equipped with stirrer, thermometer, and gas inlet and outlet were charged 450 g. (0.45mole) of poly (tetramethylene ether) glycol having a hydroxyl number of 112 and a molecular weight of 1000, along with 900 g. (0.45 mole) of poly(tetramethylene ether) glycol having a hydroxyl number of 56 and a molecular weight of 2000, both commercially available from Quaker Oats Co. The flask was heated to 110° C. under vacuum and nitrogen and maintained thereat for 1 hour. The flask was then cooled to approximately 70° C. whereat 0.1 g. of dibutyl tin dilaurate was added to the flask. A mixture of 78 g. (0.45 mole) of tolylene diisocyanate and 78 g. (0.92 mole) of allyl isocyanate was thereafter added to the flask dropwise with continuous stirring. The reaction was maintained at 70° C. for 1 hour after addition of all the reactants. The thus-formed allyl terminated prepolymer will hereinafter be referred to as Prepolymer K.

Example 12

240 g. (0.12 mole) of a polyether diol, i.e., poly(tetramethylene ether) glycol, having a molecular weight of 1990 and commercially available from the Quaker oats Co. under the trade name Polymeg 1990, were charged to a 500 ml. 3-necked flask equipped with stirrer. The flask was heated to 110° C. under vacuum and nitrogen and maintained thereat for 1 hour. The flask was then cooled to approximately 70° C. whereat 0.1 cc. of dibutyl tin dilaurate along with 14 g. (0.25mole) of allyl alcohol were added to the flask and stirring was continued for 15 minutes. Thereafter 42 g. (0.24mole) of tolylene diisocyanate (molecular weight 174) commercially available from Mobay Chemical Co. under the trade name Mondur TD–80 were added to the flask by means of a dropping funnel and the reaction was continued with stirring for 1 hour. The thus-formed allyl terminated prepolymer hereinafter will be referred to as Prepolymer L.

Example 13

600 g. (0.11 mole) of a poly(propylene ether) trio called under the trade name Triol 6000 by Union Carbide Corp., were charged to a 1-liter resin kettle along with 0.3 g. of dibutyl tin dilaurate. The kettle was heated to 110° C. under vacuum and maintained thereat for 1 hour. The kettle was then cooled to approximately 50° whereat 28.4 g. (0.342 mole) of allyl isocyanate were added slowly to keep the exotherm between 60–67° C. NCO after 20 minutes was 0.62 mg. NCO/g. The thus-formed prepolymer was then placed under vacuum at 70° C. for 1 hour followed by an additional vacuuming at 90° for 2 hours. The thus-formed allyl terminated prepolymer hereinafter will be referred to as Prepolymer M.

Example 14

600 g. (0.22 mole) of a poly(propylene ether) triol having a molecular weight of 2960 and available under the trade name Triol 3000 from Union Carbide Corp., were charged to a 1-liter resin kettle along with 0.3 g. of dibutyl tin dilaurate. The kettle was heated to 110° C. under vacuum and maintained thereat for 1 hour. The kettle was cooled to 60° C. whereat 40 g. (0.48 mole) of allyl isocyanate were added dropwise from a dropping funnel to the reaction mixture. After 20 minutes the NCO content was 0.80 mg. NCO/g. The thus-formed prepolymer was then maintained under vacuum at 70° C. for 1 hour followed by 2 hours at 90° C. This allyl terminated prepolymer will hereinafter be referred to at Prepolymer N.

PREPARATION OF PRINTING PLATES

Example 15

A liquid photocurable composition was prepared by mixing 100 g. (0.04 mole) or Prepolymer D from example 4 herein, 11 g. (0.02 mole of pentaerythritol tetrakis (β-mercaptopropionate) commercially available from Carlisle Chemical Co. under the trade name Q–43, and 1.5 g. (0.008 mole) of benzophenone commercially available in reagent grade from Fisher Scientific Co. The mixture was heated to 70° C. to dissolve the benzophenone, thereby producing a clear homogeneous mixture having a viscosity in the range of 12000–18000 cps at 30° C.

A suitable mold for making a printing plate was prepared using a 4 mil thick subbed Mylar film i.e., subbed poly(ethylene terephthalate) commercially available from Anken Chemical and Film Corp., as a support with a 35 mil thick rubber electric tape stuck thereto about its edges in order to form a frame to contain the liquid photocurable polymer. The mold was leveled on an adjustable flat table and the liquid photocurable composition at a temperature of 70° C. was poured into the mold along the edge of the frame and distributed evenly throughout the mold by means of a doctor blade. This technique produces a sufficiently flat printing surface and plate thickness tolerance of ±1 mil. An air space of 7 mil thickness between the liquid photocurable composition and a negative was maintained by means of shims at four corners of the frame. A lone negative glued to a photographic grade plate with a thin film of the liquid photocurable composition was placed on the shims with the emulsion side of the negative facing down toward the photocurable composition. The air space between the top level of the photocurable composition and the negative was maintained at 7 mils during the exposure.

The photocurable composition was exposed through the negative to actinic light from a 4000 watt Ascorlux pulsed xenon arc printing lamp, commercially available from American Speed Light Corp., placed 30 inches above the glass plate. The exposure was for 2 min., 15 sec., during which time the liquid photocurable composition gelled in the image areas. The nonimage areas remained a liquid of essentially the same viscosity as before exposure.

After exposure the negative was removed and the uncured liquid portion of the photocurable composition was removed by pouring a small amount of a liquid nonionic surfactant, e.g., Pluronic L–81 commercially available from Wyandotte Chemical Co., on the plate, brushing it with a paint brush and rinsing the liquid away with warm tap water. The photocurable composition in the image areas was observed to have gelled all the way through to the Mylar film support producing a line image having a thickness of 35 mils. The surface of the nonimage areas of the plate was the Mylar film support. The relief image adhered well to the Mylar film support and was not removed by the rinsing or developing operation. The developed plate was dried and post exposed for 2 min. under the same lamp to harden and detackify the surface.

The thus-formed plate was mounted on a newspaper press using double-face pressure-sensitive tape and printing was carried out in the same way conventional metal photoengraved plates are employed. The printing results obtained were superior to those with conventional stereotype plate.

Example 16

A liquid photocurable composition was prepared by combining 100 g. (0.04 mole) of prepolymer B from example 2 herein, 11 g. (0.02 mole) of pentaerythritol tetrakis (β-mercaptopropionate), and 1.5 g. (0.008 mole) of benzophenone. The mixture was heated to 70° C. to dissolve the benzophenone, producing a clear homogeneous mixture having a viscosity in the range of 12,000–18,000 cps.

A suitable mold for making a printing plate was prepared by adhering a pressure-sensitive 35 mil thick rubber electrical tape to the edges of a 4 mil thick subbed Mylar film support, commercially available from the Anken Chemical and Film Corp. under the trade name M41–D, to form a mold 5⅛+5⅛. An additional portion of the support was formed by pouring 31.0 g. of the liquid photocurable composition at a temperature of 70° C. into the mold and exposing it directly to actinic light from a 4000 watt Ascorlux pulsed xenon arc printing lamp placed 30 inches above the mold for 1 min., 48 sec. The thus gelled liquid photocurable composition within the mold thereby formed an additional portion of the support. An additional layer of pressure-sensitive 35 mil thick rubber electrical tape was placed on top of that already adhering to the support and 12.9 g. of the liquid photocurable composition at a temperature of 70° C. was poured into the new mold and distributed evenly throughout. A line negative was glued to a photographic grade glass plate and placed on top of the mold with a 7 mil thick airgap between the photocurable composition and the negative. The photocurable composition was then exposed to actinic light from a 4000 watt Ascorlux pulsed xenon arc printing lamp through the line negative for a period of 2 min., 48 sec. The line negative was removed and the uncured portion of the photocurable composition was washed with a small amount of a liquid nonionic surfactant, e.g., Pluronic L-81. The thus-formed printing plate was brushed with a paint brush and thereafter rinsed with warm tap water to remove the uncured portion of the plate.

This printing plate mounted on a newspaper press using double-face pressure-sensitive tape produced results superior to those obtained with a conventional lead stereotype plate.

Example 17

A liquid photocurable composition was prepared by admixing 204.2 g. (0.064mole) of Prepolymer E from example 5 herein 0.02 g. of 2,6-ditertiary-butyl-4-methylphenol as an antioxidant, 15.8 g. (0.032 mole) of pentaerythritol tetrakis (β-mercaptopropionate), 3.0 g. (0.016 mole) of benzophenone, and 60.0 microliters of an odor mask commercially available from Noville Essential Oil Co., North Bergen, New Jersey, under the trade name Odor Mask C. The mixture was heated to 70° C. to dissolve the benzophenone.

A suitable mold for making a printing plate was prepared by edging a 4 mil thick subbed Mylar film support with a pressure-sensitive 35 mil thick rubber electric tape to form a frame or mold to contain the liquid photocurable composition. The liquid photocurable composition at a temperature of 70° C. was poured into the mold along one edge of the frame and distributed evenly throughout the mold by means of a doctor blade to form a photocurable composition of 35 mil thickness. Shims were placed on the corners of the mold on top of the tape to maintain a 15 mil airgap between the surface of the photocurable composition and the line negative placed on top of said shims. The photocurable composition was exposed through the negative to an actinic light source from a 4000 watt Ascorlux pulsed xenon arc printing lamp situated 34 inches above the plate. The exposure time was 2 min., 45 sec., after which the negative was removed and the plated were rinsed with an ethanol solution consisting of 3 parts of ethanol and 2 parts water. The rinsed plates were then blotted with a paper towel. The plates were each rinsed and blotted three times. The plates were dried and post exposed for 2 min. under the same lamp to harden and detackify the printing surface.

The thus-formed plate was mounted on a newspaper press using double-face pressure-sensitive tape. The results obtained in printing were superior to those obtained with a conventional lead stereotype plate.

Example 18

Example 17 was repeated except that the photocurable composition consisted of 197.8 g. (0.91 mole) of Prepolymer F from Example 6 herein, 3.0 g. of benzophenone, 22.2 g. (0.0455 mole) of pentaerythritol tetrakis (β-mercaptopropionate), and 60.0 microliters of Odor Mask C. The printing results were comparable to those obtained in example 17.

Example 19

Example 17 was repeated except that the photocurable composition consisted of 181.8 g. (0.155 mole) of Prepolymer G from example 7 herein, 38.2 g. of pentaerythritol tetrakis (β-mercaptopropionate), 3.0 g. of benzophenone, and 120 microliters of Odor Mask C.

The printing results obtained from the thus-formed printing plate were comparable to those obtained in example 17.

Example 20

A liquid photocurable composition was prepared by mixing 10 parts of Prepolymer D from example 4 herein, 1 part of pentaerythritol tetrakis (β-mercaptopropionate), and 0.5 part acetophenone. The mixture was poured on a thin film (1mil thick) of subbed Mylar edged with pressure-sensitive 35 mil thick rubber electric tape. The Mylar support with the liquid photocurable composition on top thereof was placed in contact with a halftone negative and indirectly exposed to sunlight by means of adjustable mirrors with the sun's rays passing the negative on up through the support and into the photocurable composition for 15 minutes. Thereafter the support with the gelled composition thereon was washed with ethanol for 2 minutes to obtain a relief image. The plate was inked and hand printing resulted in very sharp definitions of the image.

Example 21

12.7 parts of Prepolymer I from example 9 herein were mixed with 1 part of pentaerythritol terakis(β-mercaptopropionate) and 0.50 part of acetophenone. A mold 35 mil in depth was set up on 4 mil thick subbed Mylar film support and the liquid photocurable composition was poured therein at 70° C. and distributed evenly throughout the mold by use of a doctor blade. Shims were placed around the edge of the mold to maintain a 7 mil airgap between the surface of the photocurable composition and a line negative paced atop the shims over the composition. The photocurable composition was exposed through the negative to a Westinghouse 275 watt sunlamp maintained at a distance of 9 inches from the composition for 3½ minutes. The negative was removed and the gelled composition was washed with hot water, followed by an ethanol wash. The dried plate was post-exposed to the sunlamp for an additional 2½ minutes to harden it and detackify the printing surface. The photocurable composition gelled all the way through to the Mylar film support, producing a line image 35 mils thick.

Example 22

A liquid photocurable composition was prepared by admixing 10.33 g. of Prepolymer M from example 13 herein, 0.0006 g. of 2,6-ditertiary-dibutyl-4-methylphenol, 0.33 g. of ethylene glycol bisβ-mercaptopropionate) commercially available from Carlisle Chemical Co., under the trade name E-23, 0.34 g. of pentaerythritol tetrakisβ-mercaptopropionate), 0.5 g. acetophenone, and 0.13 g. of a light-scattering agent, i.e., a copolymer of ethylene oxide and propylene oxide sold under the trade name Pluronic F-108 by Wyandotte Chemical Co. The photocurable composition was heated to 70° C. and poured into a mold 35 mils thick formed by 4mil thick subbed Mylar film support with pressure-sensitive electric tape around its edge. An evenly distributed surface of the photocurable composition was obtained by use of a doctor blade. Shims were placed on the edge of the mold to obtain a 20 mil air gap between the surface of the photocurable composition and a halftone negative placed on top of the shims. The photocurable composition was exposed to a carbon arc 9 inches away for a 5 minute exposure period. The negative was removed and the gelled composition was washed with water followed by an ethyl alcohol rinse. Use of this plate gave good printing results.

Example 23

Example 22 was repeated except that the photocurable composition consisted of 10.12 g. of Prepolymer N from example 14 herein, 0.0006 g. of 2,6-ditertiary-butyl-4-methylphenol, 0.88 g. of pentaerythritol tetrakisβ-mercaptopripionate), 0.50 g. of acetophenone, and 0.13 g. of light-scattering agent, i.e., a copolymer of ethylene oxide and propylene oxide sold under the trade name Pluronic F-108 by Wyandotte Chemical Co. After exposure the gelled plate was washed with water only, dried and post-exposed for 2 minutes to the carbon arc lamp. Use of this plate resulted in good printing results.

Example 24

A liquid photocurable composition was prepared by mixing 102.3 g. of Prepolymer K from example 11 herein, 7.7 g. of pentaerythritol tetrakis($\beta$-mercaptopropionate), 1.5 g. of benzophenone, and 0.1 g. of 2,6-ditertiary-butyl-4-methylphenol. The mixture was heated to 70° C. to dissolve the benzophenone and thereby producing a clear homogeneous mixture. A suitable mold for making a printing plate was prepared using a 4-mil thick subbed Mylar film as a support edged with a 35 mil thick rubber electric tape thereby forming a frame or mold to contain the liquid curable polymer. The mold was leveled on an adjustable flat table and the liquid photocurable composition at a temperature of 70° C. was poured into the mold along the edges of the frame and distributed evenly throughout the mold by means of a doctor blade. Shims were placed at the top of the edge of the mold and a halftone negative under a glass plate was placed on top of the shims leaving an air gap of 12 mils between the surface of the liquid curable composition and the halftone negative. The photocurable composition was exposed through the negative to light from a 4000 watt Ascorlux pulsed xenon arc printing lamp commercially available from American Speed Light Co. placed 29 inches above the plate. The exposure was for 3 min., 40 sec., during which time the liquid photocurable composition gelled in the image areas. The nonimage areas remained a liquid essentially of the same viscosity as prior to exposure. After exposure the negative was removed and the uncured liquid portion of the photocurable composition was removed from the support by rinsing with ethanol and thereafter wiping with a paper towel. The relief plate was dried and post cured under the same lamp for 1 minute. In the relief surface of the highlight area had a depth of 3.4 to 4.0 mils. The thus-formed printing plate was hand rolled with news ink and thereafter newsprint was placed on top of the ink plate and rolled thereon. The results obtained were superior to those of stereotype plates.

Example 25

Example 24 was repeated except that the liquid photocurable composition was prepared by using 1.5 g. of dibenzosuberone in place of benzophenone. Comparable printing results to that of example 24 were observed when using the presently prepared printing plate.

Example 26

Example 24 was repeated except that the liquid photocurable composition was prepared by using 1.5 g. of an equal mixture of thioxanthen-9-one, xanthen-9-one, 7H-benz[de] anthracen-7-one, and fluoren-9-one in place of benzophenone. Comparable printing results to that of example 24 were observed when using the presently prepared printing plate.

Example 27

Example 24 was repeated except that the liquid photocurable composition was prepared by using 1.5 g. of 1-indanone in place of benzophenone. Comparable printing results to those of example 24 were observed when using the presently prepared printing plate.

Example 28

100 parts of styrene-butadiene rubber (36.2 g.), available from General Tire and Rubber Co. under the trade name Gentro 1502, were charged to a Brabender Plastograph milling machine preheated to 85° C. and to this product was added 3.6 g. (10 parts) OF pentaerythritol tetrakis$\beta$-mercaptopropionate), 0.18 g. of benzophenone, and 0.04 g. of benzaldehyde.

Care was taken not to expose the resulting photocurable polyene/polythiol composition to significant amounts of ultraviolet light. The compound was molded under heat (100° C.) and pressure (40,000 lbs. gauge) in a platen press to a 6inch × 6 inch sheet having a thickness of 0.13 inch.

After cooling to room temperature, the photocurable polymer sheet was covered with a halftone dot negative and then by a clear glass plate (to hold the negative flat). The sheet was exposed through the negative and the glass plate for 5 minutes to (1) a carbon arc lamp 9.5 inches from the plate/negative assembly and (2) a Westinghouse RS sunlamp at a distance of 9 inches.

After exposure, the sheets were immersed in cold heptane overnight. During this time the unexposed uncured area dissolved in the heptane solvent. The curved image areas swelled in the heptane but did not dissolve. The relief image formed by the photocuring reaction was therefore developed by this solvent washing and extraction process. After removing the heptane by evaporation, the relief plate thus formed was inked on a self-inking stamp pad and then was used to reproduce (by hand stamping or hand printing) the original image derived from the halftone dot negative. The process was later repeated with equal success using a line negative instead of a halftone.

In addition to use as a printing plate on a printing press, this example illustrates another commercial application for the relief surfaces of the present invention, namely, a composition and process for making a useful, convenient rubber hand stamp.

Example 29

On a 2 inch × 2 inch × 0.063 inch sheet of plate glass was glued a sheet of black paper from which had been cut a circular section one inch in outside diameter and 0.125 inch wide. The stencil thus formed contained a cut-out image in the form of a large letter O.

The stencil supported on the glass plate was placed over a 2 inch × 2 inch ×0.125 inch layer of the photocurable composition of example 16 contained in a mold of suitable size. The stencil was exposed from above for 5 minutes to the radiation from a Westinghouse RS sunlamp held at a distance of 6 inches. Following the exposure, the stencil plate was removed and the unreacted liquid photocurable polymer was removed by flushing the mold with warm soapy water. This left the cured insoluble image area which was now in the shape of a round, elastomeric ring having the circular dimensions of the stencil.

Example 30

A liquid photocurable composition was prepared by example 5 except replacing the glycol with a phthalate esterol having a hydroxyl number of 26.8, 1.22 diester units/mole, and commercially available from Quaker Oats Co. under the trade name Polymeg 2000 Phthalate Esterol, 6.1 parts of pentaerythritol tetrakis$\beta$-mercaptopropionate), 1.5 parts of benzophenone, and 0.05 part of 2,6-ditertiary-butyl-4-methylphenol. The mixture was heated to 70° C. to dissolve the benzophenone thereby producing a clear homogeneous mixture.

A suitable mold for making a printing plate was prepared by adhering a pressure-sensitive 35 mil thick rubber electrical tape to the edges of a 4 mil thick subbed Mylar film support. The liquid photocurable composition at a temperature of 70° C. was poured into the mold along one edge of the frame and distributed evenly throughout the mold by means of a doctor blade to form a photocurable composition of 35 mil thickness. Shims were placed on the corners of the mold on top of the tape to maintain an 8 mil air gap between the surface of the photocurable composition and the halftone negative placed on top of said shims. The photocurable composition was exposed through the halftone negative to an actinic light source from 4000 watt Ascorlux pulsed xenon arc printing lamp situated 26 inches above the plate. The exposure time was 1 minute and 15 seconds, after which the negative was removed and the plate was rinsed with an aqueous ethanol solution consisting of 3 parts of ethanol and 2 parts of water. The rinsed plate was then blotted with a paper towel and dried. The dried plate was then hand rolled with news ink, newsprint was placed on top of the ink plate and rolled thereon. The printing results obtained were superior to those obtained from stereotype plates.

Example 31

The procedure of example 15 was repeated except that the subbed Mylar support layer was replaced by the following series of support surfaces: a 12 mil thick grained anodized aluminum sheet, a 12 mil thick sheet of chemically surface-treated aluminum, a 9 mil thick sheet of tin plated steel, and a 6 mil thick sheet of chemically surface-treated steel. In each case adhesion of the imaged photocured composition to the support surfaces was excellent. The resulting printing plates showed image fidelity and ink transfer characteristics. The overall printing quality was superior to that obtained with lead stereotype printing plates.

Example 32

The procedure of example 15 was repeated except that a series of formulations was prepared by replacing the prepolymer with poly(ethylene ether) glycol diacrylate (M.W. approximately 338); triallyl isocyanurate; diallyl phthalate; Hycar 1312, a liquid copolymer of butadiene and acrylonitrile of medium-high acrylonitrile content commercially available from B. F. Goodrich Co.; the tetraene obtained as the reaction product of 1 mole of epoxy resin EPON 828 commercially available from Shell Chemical Co. with 2 moles of diallyl amine (MW. approximately 580); N,N-diallylacrylamide; and diallyl allylphosphonate, respectively. In all case the amounts of benzophenone accelerator and the 2,6,-ditertiary-butyl-4-methylphenol antioxidant were held at about 1.5 parts and about 0.1 part, respectively, per 100 parts of total photocurable composition. With Hycar 1312, the amounts of pentaerythritol tetrakis$\beta$-mercapto-propionate) polythiol used was 10 parts/100 parts of Hycar 1312. In the other formulations the relative amounts of polyene and polythiol used were selected so that the ratio of reactive ene/thiol groups was approximately 1/1. Exposure times under an Ascorlux 4000 watt pulsed xenon arc lamp varied between about 60 seconds and 900 seconds. The respective printing plates after etching, drying, and post curing were inked and printed, yielding acceptable to excellent printing results in all cases.

Example 33

The procedure of example 15 was repeated except that a series of formulations were prepared by replacing the prepolymer with an equivalent stoichiometric amount of Prepolymer A from example 1; the tetraene obtained as the reaction product of 1 mole of Adiprene L–315 commercially available from E. I. du Pont de Nemours & Co. with 2 moles of trimethylolpropane diallyl ether; and the tetraene obtained as the reaction product of 1 mole of tolylene diisocyanate with 2 moles of trimethylolpropane diallyl ether.

The finished letterpress printing plates resulting from these experiments performed well in printing and were found to be excellent in image fidelity and overall printing quality and performance.

Example 34

The procedure of example 15 was repeated except that the mold depth was adjusted to 7 mils and 350 mils, respectively. The exposure times were 60 seconds and 320 seconds, respectively. After completion of the usual image development operations, the thick plate having 350 mils relief height was inked and was used to print with a flexographic technique on corrugated board stock with excellent results. The thin plate was mounted on an offset press and used as a letterset plate for the production of printed paper envelopes. Excellent printing results were experienced.

Example 35

The photocurable composition from example 15 was coated onto an anodized aluminum support sheet of 12 mils thickness to a depth of 2.0 mils using a 2 inch × 2 inch square mold of 2.0 mils wall height. The emulsion side of a photographic line positive transparency mounted on a flat Pyrex glass plate was brought into contact with the surface of the photocurable composition by allowing it to rest on the top of the walls of the mold. Using a Westinghouse Type RS 275 watt sunlamp at a distance of 6 inches, the photocurable composition was exposed imagewise for a period of 65 seconds. The exposed plate including the aluminum backing sheet was carefully peeled away and the uncured composition in the unexposed areas was removed by immersing the plate briefly and with gentle agitation in a heated aqueous detergent solution at about 80° C. An imaged intaglio surface thus prepared was rinsed with clear water and dried in a stream of warm air. The depth of relief in the wells was found to be in the range of about 1.5 to about 2.0 mils. The plate was inked with the use of a rubber ink roller. The surface ink on the nonprinting areas was removed with a Teflon-coated steel doctor blade, and then the plate was printed by rolling a sheet of paper over the surface of the plate to form an intimate contact between the paper surface and the ink in the image wells of the plate. The reproduction of the image obtained in this fashion was excellent and showed good fidelity when compared with the original art work that was being reproduced.

Example 36

A solution was prepared by blending together 10 g. of a prepolymer made by reacting 1 mole of EPON 828 (Shell Chemical Co.) with 2 moles of diallyl amine, 0.15 g. of benzophenone, 5.7 g. of tetrathiol sold under the trade name Q–43 (Carlisle Chemical Co.), and 20 g. of cellosolve acetate. This solution was coated onto a brush-grained 10 inch ×16 inch ×0.006 inch aluminum sheet. The coated surface was placed in contact with a screened negative transparency by means of a vacuum frame and exposed to ultraviolet radiation from a carbon arc source at a distance of 20 inches for 1.5 minutes. The plate was developed with cyclohexanone, rinsed with tap water gummed with 7° Baume gum arabic solution, and rubbed up with rub-up ink. An image of excellent quality was obtained. The plate having an image thickness of about 0.4 mil was used to print 100,000 impressions on a Davidson Model 241 offset duplicator press.

Example 37

A solution was prepared by blending 10 g. of a prepolymer made by reacting 1 mole of tolylene diisocyanate with 2 moles of the diallyl ether of trimethylolpropane, 10 g. of tetrathiol sold under the trade name Q–43 (Carlisle Chemical Co.), 1.5 g. of benzophenone, and 10 g. of cellosolve acetate. The solution was used to make a wipe-on coating onto a grained, anodized aluminum sheet 10 inch × 16 inch × 0.009 inch. The plate was exposed in the same manner as described in example 36 except that the image was developed by using a commercial developed sold by Durolith Corporation under the trade name Developer D–250. An image of excellent quality was obtained. This plate having an image thickness of about 3 mils was used to print 100,000 impressions on a Davidson Model 241 offset duplicator press.

Example 38

A solution was prepared by blending 20 g. of a prepolymer made by reacting 1 mole of Polyethylene Ether Glycol 4000

(J. T. Baker Co.) with 2 moles of tolylene isocyanate and 2 moles of the diallyl ether of trimethylolpropane, 2.6 g. of tetrathiol sold under the trade name Q–43 (Carlisle Chemical Co.), 0.3 g. of benzophenone, and 46 g. of cellosolve acetate. The solution was used to make a wipe-on coating onto a grained copper plate 10 inch × 16 inch × 0.009 inch. The plate was exposed in the same manner as described in example 36 except that a positive transparency was used, the exposure time was 2 minutes, and tap water was used to develop the image. After exposure and development the polymer coating remaining on the plate was hydrophilic. The exposed copper surface was an ink receptive printing surface. This plate printed good quality impressions on a Davidson Model 241 offset duplicator press.

The photocurable composition useful herein provides a simple, effective means for producing original, direct relief printing plates from inexpensive materials with a marked reduction in labor and time requirements over the conventional procedures. The relief images obtained are sharp and show fidelity to the original transparency both in small details and in overall dimensions. In addition, preparation of many types of ruled line plates are possible which could ordinarily be handled only by tedious engraving techniques.

The prepared printing plates permit efficient use of valuable press time since the flatness of the printing surfaces reduces the amount of make ready required. A smooth clean shoulder of the printing relief image minimizes ink buildup during use and saves much of the time spent in cleaning operations during a press run.

Under optimum conditions the present printing plates show wear resistance equivalent to that of the expensive nickel-faced electrotypes of chromium plated metallic plates.

The lightness in weight of the present plates permits easier handling characteristics, faster printing press speeds, and the use of lighter weight printing presses. These factors become obvious when it is realized that a newspaper stereotype printing plate weighs 55 pounds as contrasted to less than 0.5 pound for the preferred plates prepared according to the method of this invention.

As used herein the term polyene and the term polyyne refer to single or complex species of alkenes or alkynes, liquid at or below 70° C., having a multiplicity of terminal reactive carbon-to-carbon unsaturated functional groups per average molecule. For example, a diene is a polyene that has two reactive carbon-to-carbon double bonds per average molecule, while a diyne is a polyyne that contains in its structure two reactive carbon-to-carbon triple bonds per average molecule. Combinations of reactive double bonds and reactive triple bonds within the same molecule are also possible such as for monovinylacetylene which is a polyeneyne under this definition. For purposes of brevity all these classes of compounds are referred to herein as polyenes.

Functionality as used herein refers to the average number of ene or thiol groups per molecule in the polyene or polythiol, respectively. For example, a triene is a polyene with an average of three reactive carbon-to-carbon unsatruated groups per molecule and thus has a functionality of three. A dithiol is a polythiol with an average of two thiol groups per molecule and thus has a functionality of two.

It is to be understood that the functionality of the polyene and the polythiol component is commonly expressed in whole numbers although in practice the actual functionality maybe fractional. For example, a polyene component having a nominal functionality of two (from theoretical considerations alone) may in fact have an effective functionality of somewhat less than two. In an attempted synthesis of a diene from a glycol in which the reaction proceeds to 100 percent of the theoretical value for complete reaction, the functionality (assuming 100percent pure starting materials) would be 2.0. If, however, the reaction were carried to only 90 percent of theory for complete reaction, about 10 percent of the molecules present would have only one ene functional group, and there may be a trace of material that would have no ene functional groups at all. Approximately 90 percent of the molecules, however, would have the desired diene structure and the product as a whole then would have an actual functionality of 1.9 . Such a product is useful in the instant invention and is referred to herein as having a functionality of two.

The term reactive unsaturated carbon-to-carbon groups means groups which will react under proper conditions as set forth herein with thiol groups to yield the thioether linkage $$-\overset{|}{\underset{|}{C}}-S-\overset{|}{\underset{|}{C}}$$

as contrasted to the term unreactive carbon-to-carbon unsaturation which means $$-\overset{|}{C}=\overset{|}{C}-$$

groups found in aromatic nuclei (cyclic structures exemplified by benzene, pyridine, anthracene, and the like) which do not under the same conditions react with thiols to give thioether linkages.

It is understood that the foregoing detailed description is given merely by way of illustration and that many variations may be made therein without departing from the spirit of this invention.

What is claimed is:

1. A method for forming a photoinsolubilized photocured printing plate which comprises exposing to actinic radiation projected through an image-bearing transparency selected portions of a photocurable composition comprising a liquid polyfunctional component having molecules containing at least two reactive ethylenically or acetylenically unsaturated carbon-to-carbon bonds per molecule, and a liquid polythiol component having molecules containing at least two thiol groups per molecule, with the total functionality of the polyfunctional component and the polythiol component being greater than four, for a sufficient time to insolubilize the photocurable composition in the exposed portions and thereafter removing the unexposed photocurable composition.

2. The method of claim 1 wherein the photocurable composition contains a photocuring rate accelerator.

3. The method of claim 2 wherein the photocurable rate accelerator is selected from the group consisting of aryl aldehyde, diaryl ketone, alkyl aryl ketone, triaryl phosphine, and a blend of carbon tetrahalide with polynuclear aromatic hydrocarbon.

4. The method of claim 1 wherein the actinic radiation is ultraviolet radiation having a wavelength between about 2000 A and about 4000 A.

5. The method of claim 1 wherein the photocurable composition is adhered to a support layer during exposure to actinic radiation.

6. The method of claim 1 wherein an air gap from about 0.1 to about 250 mils is maintained between the image-bearing transparency and the photocurable composition during exposure to actinic radiation.

7. The method of claim 1 wherein the unexposed photocurable composition is removed by an aqueous medium.

8. The method of claim 5 wherein the support layer has a light absorptive layer intermediate it and the photocurable composition.

9. The method of claim 1 wherein the photocurable composition contains a member of the group consisting of a filler, pigment, odor mask, light-scattering agent, plasticizer and antioxidant in an effective amount equal to about 0.005 to about 500 parts per 100 parts of the photocurable composition.

10. The method of claim 1 wherein the thickness of the photocurable composition exposed to actinic radiation is about 0.1 mil to about 500 mils.

11. The method of claim 10 wherein the thickness is from about 0.1 mil to about 5 mils.

12. The method of claim 10 wherein the thickness is from about 5 mils to about 30 mils.

13. The method of claim 10 wherein the thickness is from about 10 mils to about 500 mils.

14. The method of claim 5 wherein the support layer is plastic.

15. The method of claim 5 wherein the support layer is an aluminum, copper, or steel-containing metal.

16. The method of claim 5 wherein the support layer is paper.

17. The method of claim 2 wherein the photocuring rate accelerator is present in an effective amount from about 0.0005 to about 50 percent by weight of the photocurable composition.

18. The method of claim 2 wherein the photocuring rate accelerator is present in an effective amount from about 0.05 to about 25 percent by weight of the photocurable composition.

* * * * *